United States Patent
Gianella et al.

(10) Patent No.: US 7,542,483 B1
(45) Date of Patent: Jun. 2, 2009

(54) RECOVERABLE REFERENCE CLOCK ARCHITECTURE FOR SONET/SDH AND ETHERNET MIXED BIDIRECTIONAL APPLICATIONS

(75) Inventors: Roberto Gianella, Milan (IT); Marco De Angeli, Barzana (IT); Marco Portinari, Bresso (IT); Thomas Hamilton, Milpitas, CA (US)

(73) Assignee: Cisco Technology, Inc., San Jose, CA (US)

( * ) Notice: Subject to any disclaimer, the term of this patent is extended or adjusted under 35 U.S.C. 154(b) by 941 days.

(21) Appl. No.: 10/603,699

(22) Filed: Jun. 25, 2003

(51) Int. Cl.
*H04J 3/06* (2006.01)
(52) U.S. Cl. .................... 370/503; 370/350
(58) Field of Classification Search ............ 370/518, 370/375.03, 509, 510, 512, 516, 503, 350, 370/535–541, 395.1–395.7
See application file for complete search history.

(56) References Cited

U.S. PATENT DOCUMENTS

| | | | |
|---|---|---|---|
| 5,113,152 A * | 5/1992 | Norimatsu | 331/11 |
| 5,483,527 A * | 1/1996 | Doshi et al. | 370/399 |
| 5,574,757 A * | 11/1996 | Ogawa | 375/376 |
| 5,870,441 A * | 2/1999 | Cotton et al. | 375/354 |
| 6,188,692 B1 | 2/2001 | Huscroft et al. | 370/395 |
| 6,516,001 B1 | 2/2003 | Sato | 370/466 |
| 6,631,144 B1 * | 10/2003 | Johansen | 370/516 |
| 6,754,171 B1 * | 6/2004 | Bernier et al. | 370/216 |
| 6,831,932 B1 * | 12/2004 | Boyle et al. | 370/539 |
| 6,943,609 B2 * | 9/2005 | Zampetti et al. | 327/292 |
| 7,110,354 B2 * | 9/2006 | Nham | 370/219 |
| 2007/0031153 A1 * | 2/2007 | Aronson et al. | 398/138 |

OTHER PUBLICATIONS

"10 Gigabit Ethernet Technology Overview White Paper," Rev. 2, Draft A, 10 Gigabit Ethernet Alliance, Apr. 2002, cover and 17 pages.

* cited by examiner

*Primary Examiner*—Ricky Ngo
*Assistant Examiner*—Gary Mui
(74) *Attorney, Agent, or Firm*—Edell, Shapiro & Finnan, LLC

(57) ABSTRACT

Systems and methods for employing asynchronous transceivers in synchronous data communications. For example, a 10 Gigabit Ethernet transceiver may be used to support SONET/SDH communications with or without G.709 coding. Such a transceiver is clocked with a recovered clock signal when a received synchronous signal is available and with a locally generated clock when no such remotely generated signal is available.

14 Claims, 3 Drawing Sheets

RECOVERABLE REFERENCE CLOCK ARCHITECTURE FOR SONET/SDH AND ETHERNET MIXED BIDIRECTIONAL APPLICATIONS

BACKGROUND OF THE INVENTION

The present invention relates to data networking, and in certain embodiments to clock recovery in data networking applications.

As service provider optical transport networks grow and evolve to incorporate more advanced technologies, they increasingly make use of multiple types of optical signal, rather than just one that is standardized across the network. The various optical transmission standards include synchronous transmission standards where the various network nodes share common transmission timing and asynchronous transmission standards where each node transmits in accordance with its own clock. Synchronous transmission standards include, e.g., SDH, SONET, etc. Asynchronous transmission standards include e.g., 1 Gigabit Ethernet, 10 Gigabit Ethernet, etc.

The network manager thus confronts a wide variety of optical transmission standards, and consequently a wide variety of optical transponders that are responsible for transmitting and receiving the optical signals. Unfortunately, given the inherent compatibility differences between transmission standards, a transponder of one type can only be used with signals of that type. The result is great inflexibility in network configuration. Transponders specified for one signal type can only be used with that signal type and not with other signal types.

A need thus arises for employing a single transponder that can send and receive using multiple optical transmission standards. A problem, however, arises in using a single design of transponder and associated circuitry with both synchronous and asynchronous transmission standards. Such a transponder may be found on a line-card of a network device. On what is referred to as the "trunk side," the transponder has an optical interface to couple to an optical transmission medium. On what is referred to as the "client side," the transponder interfaces to a backplane connector of the network device. Data received from the backplane connector is sent out over the optical interface and vice versa.

The interface to the backplane is a high-speed electrical interface and it is desirable to use commercially available integrated circuits. Such integrated circuits have been developed for use with the 10 Gigabit Ethernet transmission standard. These parts, referred to as "transceivers," assume an asynchronous timing architecture. Both directions of data output by the transceiver are clocked by a local reference clock source.

It would be desirable to use an asynchronous data transmission standard transceiver to also carry data which is carried in accordance with a synchronous transmission standard on the trunk side. However, it is not appropriate to clock SONET or SDH transmissions using a locally generated clock source. Instead, the timing for these transmissions is determined based on a clock that has been recovered from a received signal. What is needed are systems and methods for employing asynchronous transmission standard transceivers to support participation in synchronous communications.

SUMMARY OF THE INVENTION

Embodiments of the present invention provide systems and methods for employing asynchronous transceivers in synchronous data communications. For example, a 10 Gigabit Ethernet transceiver may be used to support SONET/SDH communications with or without G.709 coding. Such a transceiver is clocked with a recovered clock signal when a received synchronous signal is available and with a locally generated clock when no such remotely generated signal is available.

A first aspect of the present invention provides a method for operating a transceiver for an asynchronous data transmission standard to relay data in accordance with a synchronous data transmission standard. The method includes: receiving a remotely transmitted signal formatted in accordance with the synchronous data transmission standard, recovering a clock signal from the remotely transmitted signal, in a first mode, directing the recovered clock signal to a clock input of the transceiver, and, in a second mode, directing a locally generated clock to the clock input.

A second aspect of the present invention provides apparatus for operating a transceiver for an asynchronous data transmission standard to relay data in accordance with a synchronous data transmission standard. The apparatus includes: a transponder that receives a remotely transmitted signal formatted in accordance with the synchronous data transmission standard and recovers a clock signal from the remotely transmitted signal, a local clock source, and a multiplexer that, in a first mode, directs the recovered clock signal to a clock input of the transceiver and, in a second mode, directs output of the local clock source to the clock input.

Further understanding of the nature and advantages of the inventions herein may be realized by reference to the remaining portions of the specification and the attached drawings.

DESCRIPTION OF SPECIFIC EMBODIMENTS

Figure 1:
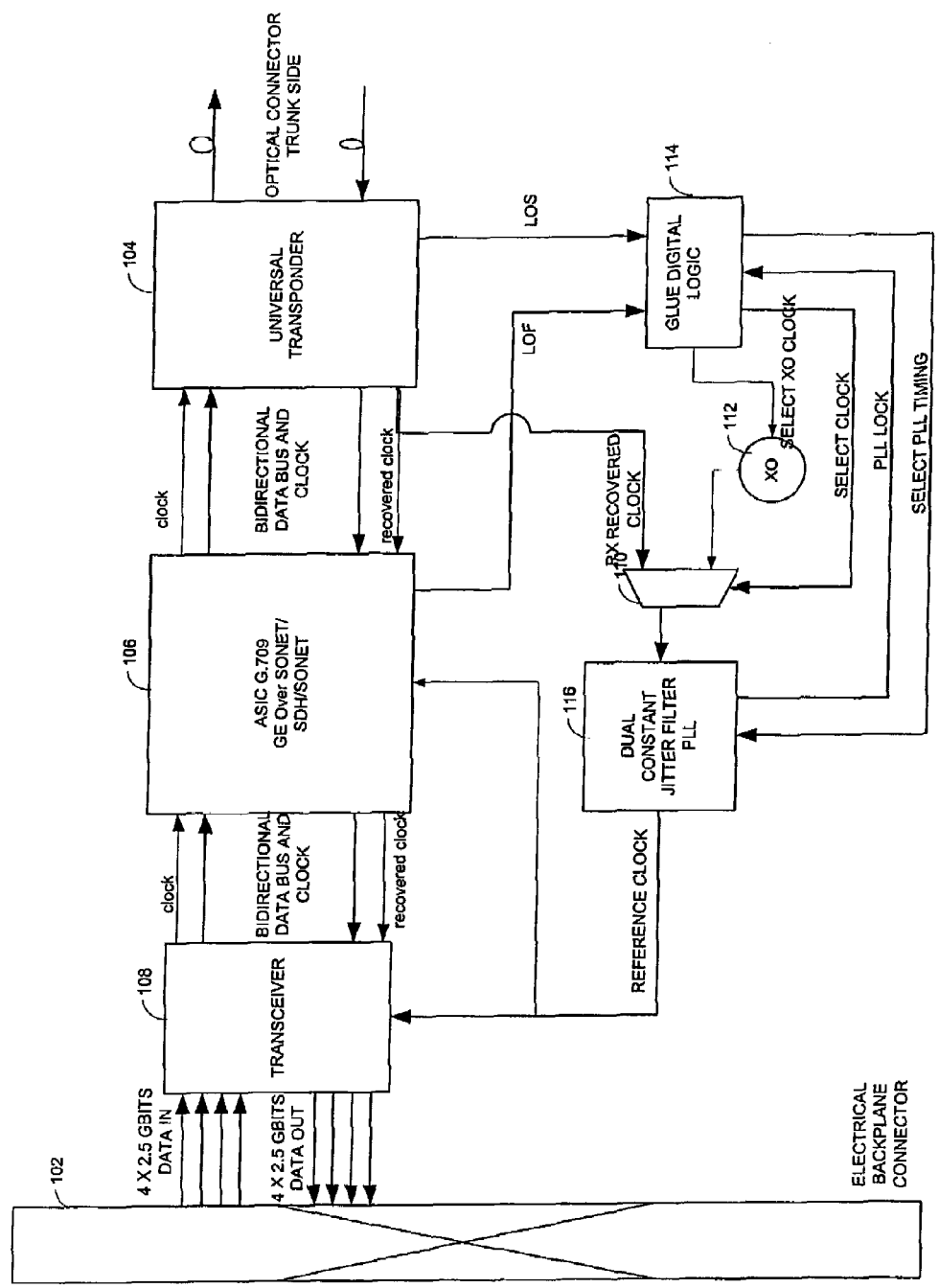
FIG. 1 depicts elements of a line-card according to one embodiment of the present invention.

FIG. 1 depicts a line-card as would exist in a network device forming part of an optical network according to one embodiment of the present invention. The line-card of FIG. 1 may be used for various types of optical communications including synchronous optical communications, e.g., SONET/SDH or asynchronous optical communications, e.g., 10 Gigabit Ethernet. The various types of optical communications may employ G.709 framing (which for the OTU-2 line rate will increase the bit rate by 85/79) and Forward Error Correction (FEC) may be enabled on the line-card. On the trunk side, the line-card connects to an optical transmission medium or an optical multiplexer/demultiplexer that aggregates multiple wavelengths onto a single optical transmission medium. On the client side, the line-card communicates electrically with a backplane connector 102 that connects the other linecards on the same network device. The other line-cards may be, e.g., similar to the line-card of FIG. 1 or they may operate lower speed interfaces such as conventional Ethernet interfaces, ATM interfaces, DS-3 interfaces, etc.

A universal transponder 104 uses digital data to modulate an optical signal to be transmitted and furthermore recovers digital data from a received optical signal. Universal transponder 104 operates in accordance with a currently active optical transmission standard whether it be a synchronous transmission standard or an asynchronous transmission standard. For both synchronous and asynchronous transmission standards, universal transponder 104 recovers a clock signal from the received signal as a part of its Clock and Data Recovery (CDR) function. A framing processor 106 is responsible for encapsulation and deencapsulation of data within the framing structure of the operative optical transmission standard. For SONET/SDH, framing techniques include Packet Over SONET (POS) and Generic Framing Procedure (GFP). The G.709 standard specifies its own framing procedures.

Framing processor 106 is responsible for encapsulation and deencapsulation and also for mapping data to or from the correct TDM position for the synchronous data transmission standards. Framing processor 106 also performs forward error correction operations when the line-card is in the appropriate mode. Framing processor 106 may be implemented, e.g., as an ASIC, or in any other suitable way.

A physical layer transceiver 108 is responsible for handling communication to and from backplane connector 102. Physical layer transceiver 108 operates in accordance with the 10 Gigabit Ethernet standard. In particular, transceiver 108 interacts with framing processor 106 in accordance with the XGMII standard. Communications with other line-cards via backplane connector 102 are specified by the XAUI transmission standard defined by 10 Gigabit Ethernet. The XAUI interface employs four bidirectional 2.5 Gbps lines. The XGMII link may employ, e.g., 64 155 Mbps lines, 16 622 Mbps lines, etc. Functions of transceiver 108 include: multiplexing together of data streams from backplane connector 102; demultiplexing of data streams bound for data connector 102; serialization and deserialization of data; 10B/8B encoding and decoding; etc. In one particular implementation, transceiver 108 is a PMC Sierra PM 8355. Comparable devices are available from, e.g., Motorola, Cypress Semiconductor, etc.

Transceiver 108 has been developed to handle Ethernet traffic. To use it for synchronous traffic such as SONET/SDH requires special adaptation. Transceiver 108 employs a single reference clock to align an internal phase lock loop. Timing for both directions of data transmission is based on this reference clock. In Ethernet operation, it is assumed that this reference clock is locally generated. It is typically locally generated by a crystal oscillator (XO) with high stability (+/−50 ppm). However, for synchronous operations such as SONET/SDH, it is necessary to base timing on the clock signal that is recovered by universal transponder 104. However, if the received signal is somehow lost, timing of transceiver 108 should be based on a local source.

A multiplexer 110 switches between the two timing sources, the recovered clock signal from universal transponder 104 and a local clock signal generated by an XO 112. XO 112 is actually a set of clocks of different rates corresponding to different operation modes. Switching between the two timing sources depends on presence or absence of a received optical signal as indicated by a loss-of-signal (LOS) output by universal transponder 104 or a loss-of-frame (LOF) provided by framing processor 106. The LOS indication is generated, e.g., when received signal strength goes below a certain level, detectable errors increase above a certain level, etc. Framing processor 106 may generate an LOF indication when it no longer detects the expected bit pattern used to determine boundaries between frames. The LOS and LOF conditions clear when the signal and/or framing are recovered.

A glue logic block 114 controls the operation of multiplexer 110. Glue logic block 114 also time filters the LOS and LOF alarm signals to avoid control loop instability. Other functions of glue logic block 114 include selecting the appropriate clock rate for XO 112 depending on the currently programmed signal type, selecting a time constant for PLL 116, and setting a divider value within PLL 116 to reflect whether G.709 FEC operation is enabled. Glue logic block 114 may be implemented as e.g., a complex programmable logic device (CPLD), as part of an ASIC, as a field programmable gate array (FPGA), etc.

Figure 2:
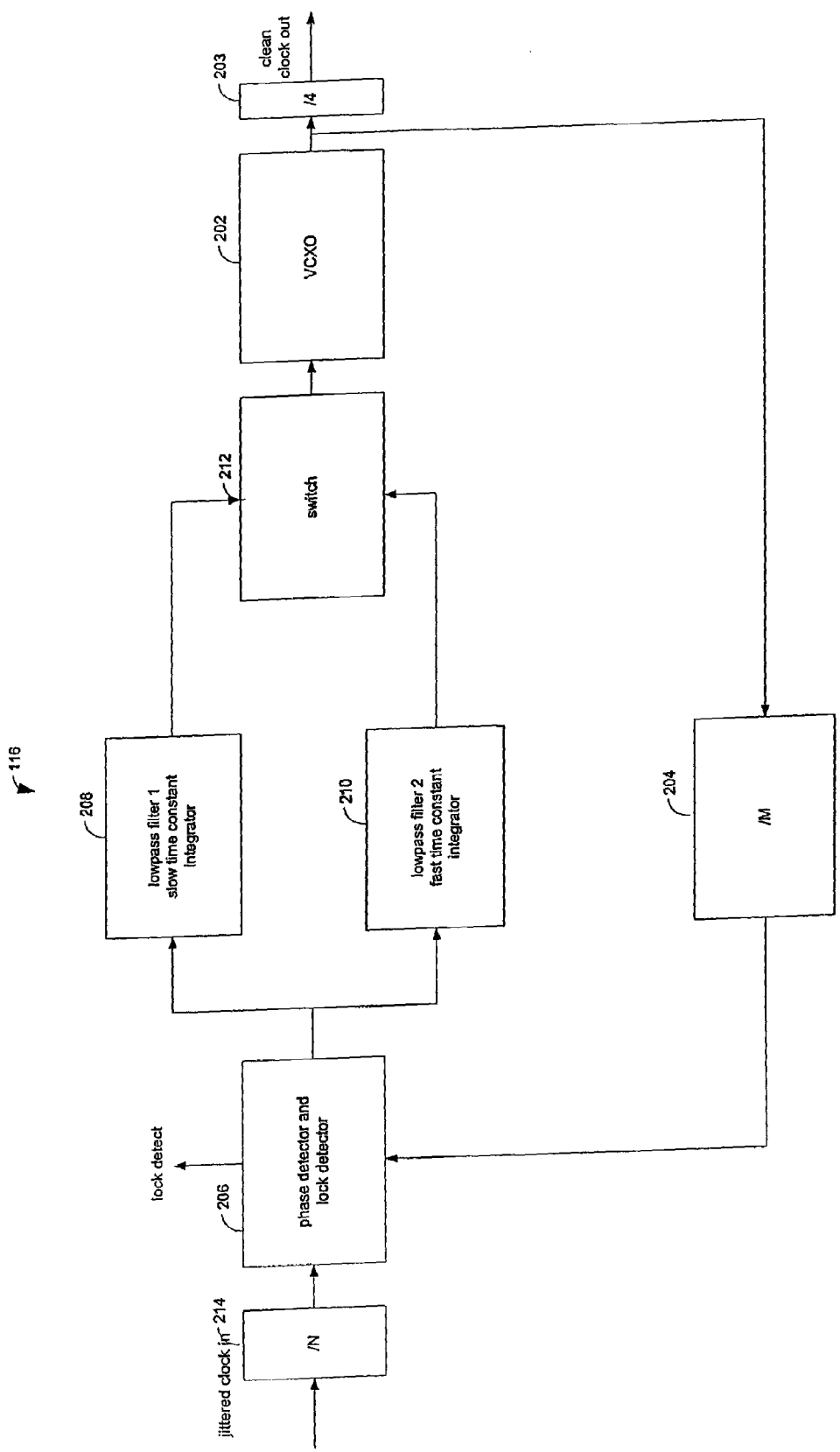
FIG. 2 depicts a dual constant jitter filter PLL according to one embodiment of the present invention.

Before input to transceiver 108, the selected clock signal is processed by a dual constant jitter filter phase locked loop (PLL) 116. PLL 116 filters out timing jitter from the selected clock signal. FIG. 2 depicts internal structure of PLL 116. The recovered clock from transponder 104 is essentially a "jittered" clock generated from transitions in the data stream. PLL 116 uses the jittered clock to generate a "clean" clock that can be used for timing purposes. A VCXO (voltage controlled crystal oscillator) 202 outputs the clean clock, through a divide-by-four stage 203, and is locked to the jittered clock by the operation of the loop. The clean clock output is fed to a divide-by-M stage 204 that divides the frequency of VCXO 202 by M. M=79 in a particular implementation. The divided output is fed to a phase detector (and lock detector) 206 that measures the phase difference between this divided clock signal and the jittered clock.

The jittered input clock itself has been rescaled by a divide-by-N stage 214. In one embodiment, the value of N is set to 79 for non-G.709 operation or to 85 for G.709 operation. Thus when G.709 encoding is enabled, PLL 116 converts frequency to achieve an 85:79 ratio. When G.709 encoding is disabled, PLL 116 achieves a 1:1 ratio. The output of phase detector 206 is a signal proportional to the phase difference and this is input to one of two lowpass filters 208 and 210. A switch 212 selects which lowpass filter output will drive the input of VCO 202. The filters have different time constants.

Thus according to embodiments of the present invention, two different time constants may be used for filtering timing jitter within PLL 116. For example, there is a slow time constant of e.g., approximately 100 milliseconds and a fast time constant of, e.g., 1 millisecond. The slow time constant is used during periods when the recovered clock signal is being used as the reference clock of transceiver 108. The fast time constant is used during the transition period from use of the recovered clock signal to use of the local XO until lock is achieved to the local XO. The slow time constant is specified to guarantee drift of less than approximately 100 ppm in 10 milliseconds. The fast time constant is used when transitioning from use of the XO to use of the recovered clock signal. This provides speedy acquisition to the recovered clock signal. It does not matter which time constant is used while the XO is used as a source since the XO is stable and relatively jitter-free.

Figure 3:
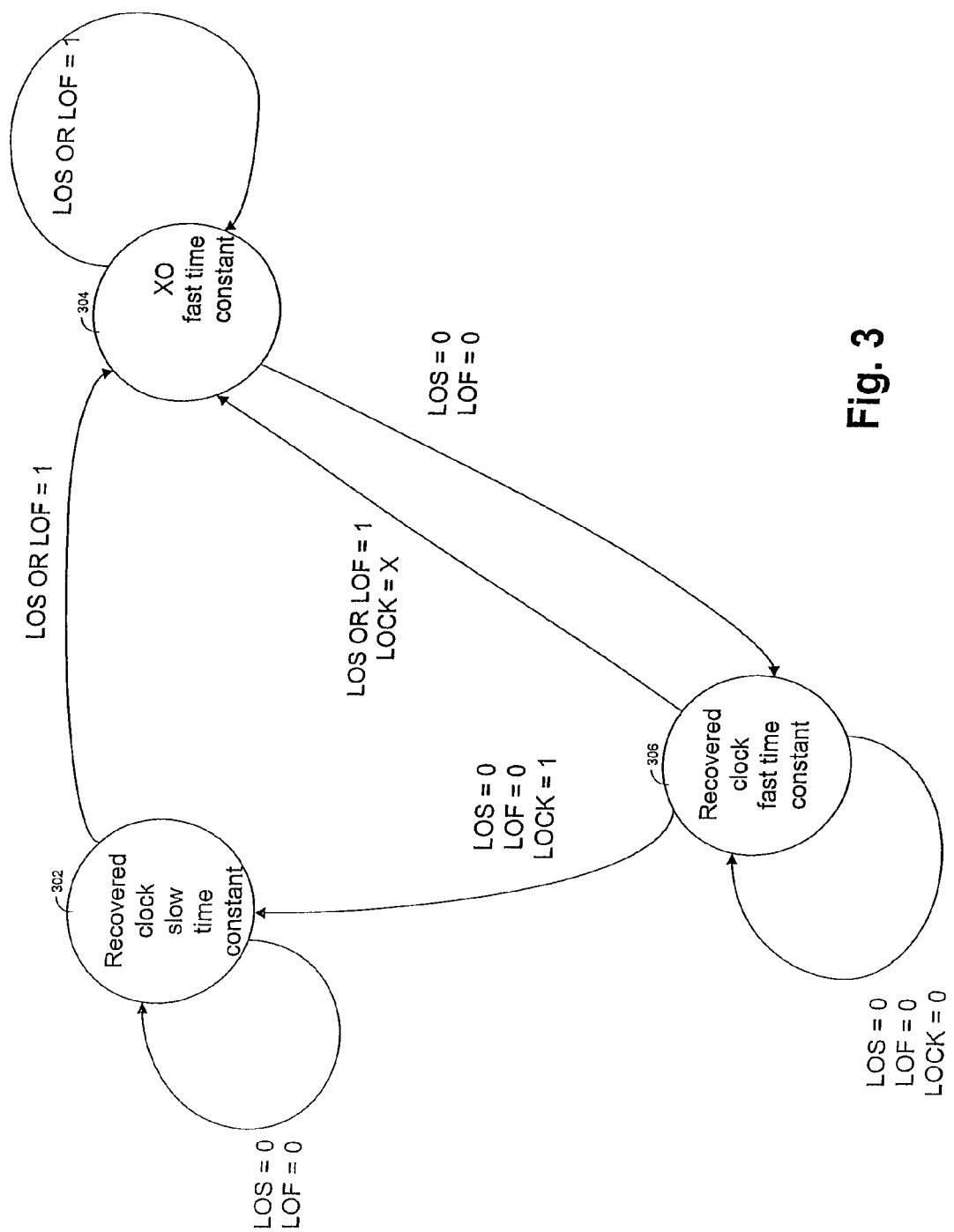
FIG. 3 depicts a simplified state diagram for clock recovery operation according to one embodiment of the present invention.

FIG. 3 depicts a simplified state transition diagram for the operation of glue logic 114. There are three different states and each state is identified by a combination of the currently selected clock source and the currently selected time constant. In a state 302, the clock source is the recovered clock signal from universal transponder 104 and the time constant is slow. This is the error-free condition and as long as neither LOF nor LOS are asserted, glue logic 114 remains in state 302.

The assertion of either the LOF or LOS signal causes a transition from state 302 to a state 304. In state 304, the clock source is XO 112 and the PLL time constant is fast. Glue logic 114 remains in state 304 as long as either LOF or LOS are asserted. When alignment is recovered, (both LOS and LOF are no longer asserted), glue logic 114 transitions to a state 306.

In state 306, the recovered clock signal from universal transponder 104 is the reference clock source and the PLL time constant is fast. In this state, glue logic 114 waits for a lock indication from PLL 116. If, however, LOF or LOS become asserted first, there is a return to state 304. When lock does occur in state 306, glue logic 114 returns to state 302.

It is understood that the examples and embodiments that are described herein are for illustrative purposes only and that various modifications and changes in light thereof will be suggested to persons skilled in the art and are to be included within the spirit and purview of this application and scope of the appended claims and their full scope of equivalents.

The invention claimed is:

1. A method for operating a line-card having a transponder and a transceiver for an asynchronous data transmission standard to relay data in accordance with a synchronous data transmission standard, said method comprising:
   receiving a remotely transmitted signal formatted in accordance with said synchronous data transmission standard by said transponder;
   recovering a clock signal from said remotely transmitted signal by said transponder;
   in a first mode, directing said recovered clock signal to a clock input of said transceiver;
   in a second mode, directing a locally generated clock to said clock input of said transceiver;
   switching from said first mode to said second mode upon loss of said remotely transmitted signal or upon loss of recovered framing in said remotely transmitted signal;
   during said first mode, filtering said clock input using a phase lock loop operating at a first (fast) time constant; and
   when switching from said second mode to said first mode, filtering said clock input using said phase lock loop operating at a second time constant, said second time constant being shorter than said first time constant.

2. The method of claim 1 wherein said synchronous data transmission standard is a SONET standard.

3. The method of claim 1 wherein said synchronous data transmission standard is a G.709 standard.

4. The method of claim 1 wherein said asynchronous data transmission standard is an Ethernet standard.

5. The method of claim 1 further comprising:
   transferring data recovered from said remotely transmitted signal to said transceiver for demultiplexing.

6. The method of claim 5 further comprising:
   using said transceiver to multiplex together multiple data streams to form a data signal for modulation onto an optical signal, said data signal being clocked by said recovered clock signal in said first mode and by said local clock in said second mode.

7. The method of claim 1 further comprising:
   when switching from said first mode to said second mode, filtering said clock input using said phase lock loop operating at said second time constant.

8. The method of claim 1, wherein in switching from said second mode to said first mode, directing said recovered clock signal to said clock input of said transceiver; and
   filtering said clock input using said phase lock loop operating at a said first time constant when said phase lock loop is locked to said recovered clock signal.

9. Apparatus for operating a transceiver for an asynchronous data transmission standard to relay data in accordance with a synchronous data transmission standard, said apparatus comprising:
   a transponder that receives a remotely transmitted signal formatted in accordance with said synchronous data transmission standard and recovers a clock signal from said remotely transmitted signal;
   a local clock source;
   a multiplexer that, in a first mode, directs said recovered clock signal to a clock input of said transceiver and, in a second mode, directs output of said local clock source to said clock input of said transceiver, said multiplexer switching from said first mode to said second mode upon loss of said remotely transmitted signal and switching from said first mode to said second mode upon loss of recovered framing in said remotely transmitted signal; and
   a phase lock loop that, during said first mode, filters said clock input using a first time constant and when switching from said second mode to said first mode, filters said clock input using a second time constant, said second time constant being shorter than said first time constant.

10. The apparatus of claim 9 wherein said synchronous data transmission standard is a SONET standard.

11. The apparatus of claim 9 wherein said synchronous data transmission standard is a G.709 standard.

12. The apparatus of claim 9 wherein said asynchronous data transmission standard is an Ethernet standard.

13. The apparatus of claim 9 wherein data recovered from said remotely transmitted signal is transmitted to said transceiver for demultiplexing.

14. The apparatus of claim 9 wherein, when switching from said first mode to said second mode, said phase lock loop filters using said second time constant.

* * * * *